(12) United States Patent
Xu et al.

(10) Patent No.: US 10,425,739 B2
(45) Date of Patent: Sep. 24, 2019

(54) ACOUSTIC DEFLECTOR WITH CONVECTIVE COOLING

(71) Applicant: Bose Corporaton, Framingham, MA (US)

(72) Inventors: Zhen Xu, Ashland, MA (US); Guanghua Shi, Shenzhen (CN); Peter J. Wagner, II, Worcester, MA (US); K. Venkat Subramaniam, Westborough, MA (US)

(73) Assignee: Bose Corporation, Framingham, MA (US)

( * ) Notice: Subject to any disclaimer, the term of this patent is extended or adjusted under 35 U.S.C. 154(b) by 0 days.

(21) Appl. No.: 15/723,919

(22) Filed: Oct. 3, 2017

(65) Prior Publication Data

US 2019/0104367 A1    Apr. 4, 2019

(51) Int. Cl.
| | |
|---|---|
| *H04R 9/02* | (2006.01) |
| *H04R 9/06* | (2006.01) |
| *H04R 1/34* | (2006.01) |
| *H04R 1/02* | (2006.01) |
| *H04R 1/28* | (2006.01) |
| *H05K 7/20* | (2006.01) |

(52) U.S. Cl.
CPC ............. *H04R 9/022* (2013.01); *H04R 1/025* (2013.01); *H04R 1/028* (2013.01); *H04R 1/345* (2013.01); *H04R 9/06* (2013.01); *H04R 1/2819* (2013.01); *H04R 2201/028* (2013.01); *H04R 2201/029* (2013.01); *H05K 7/20127* (2013.01)

(58) Field of Classification Search
CPC .......... H04R 9/022; H04R 9/06; H04R 1/025; H04R 1/345; H04R 2201/029
See application file for complete search history.

(56) References Cited

U.S. PATENT DOCUMENTS

| | | | | |
|---|---|---|---|---|
| 3,778,551 | A | * 12/1973 | Grodinsky | ............... H04R 1/02 361/693 |
| 3,892,917 | A | 7/1975 | Sotome | |
| 3,912,866 | A | * 10/1975 | Fox | ....................... H04R 1/2865 181/155 |
| 4,322,578 | A | 3/1982 | Selmin | |
| 4,348,549 | A | 9/1982 | Berlant | |
| 4,620,317 | A | 10/1986 | Anderson | |
| 4,811,403 | A | * 3/1989 | Henricksen | .............. H04R 1/02 181/152 |

(Continued)

FOREIGN PATENT DOCUMENTS

| | | |
|---|---|---|
| CA | 2795676 A1 | 12/2011 |
| DE | 102011016326 A1 | 10/2012 |

(Continued)

OTHER PUBLICATIONS

McRitchie, Don, "Aquarius: A Noble Experiment", Audioheritage.com, 2001, accesses Mar. 5, 2015, 9 pages.

(Continued)

*Primary Examiner* — Joshua Kaufman (57) ABSTRACT

A deflector assembly includes an acoustic deflector that defines at least a portion of an electronics compartment; and electronics mounted within the electronics compartment. The deflector assembly is configured to provide convective cooling of the electronics via a stack effect air flow through the electronics compartment.

24 Claims, 6 Drawing Sheets

(56) References Cited

U.S. PATENT DOCUMENTS

| | | | |
|---|---|---|---|
| 5,097,513 A * | 3/1992 | Jordan | H04R 3/00 381/111 |
| 5,115,882 A | 5/1992 | Woody | |
| 5,119,430 A * | 6/1992 | Peavey | H04R 1/02 381/121 |
| 5,268,538 A | 12/1993 | Queen | |
| 5,418,336 A | 5/1995 | Negishi et al. | |
| 5,426,707 A * | 6/1995 | Wijnker | H04R 9/022 381/165 |
| 5,792,999 A * | 8/1998 | Arnold | G10K 11/172 181/141 |
| 6,009,972 A | 1/2000 | Choi et al. | |
| 6,026,928 A | 2/2000 | Maharaj | |
| 6,064,744 A | 5/2000 | Augustin | |
| 6,257,365 B1 | 7/2001 | Hulsebus, II | |
| D476,310 S | 6/2003 | Hisatsune | |
| D476,311 S | 6/2003 | Hisatsune | |
| 6,597,797 B1 | 7/2003 | Betts | |
| 6,723,913 B1 * | 4/2004 | Barbetta | H04R 9/022 174/17 VA |
| D508,042 S | 8/2005 | Oikawa | |
| 6,944,024 B1 * | 9/2005 | Devine, III | H04R 9/022 165/185 |
| 6,956,956 B2 * | 10/2005 | Kuratani | H04R 1/02 381/345 |
| D521,979 S | 5/2006 | Ishibashi | |
| 7,202,577 B2 * | 4/2007 | Parison | B60G 17/0157 310/14 |
| D545,299 S | 6/2007 | Tsuge | |
| 7,388,963 B2 * | 6/2008 | Han | H04R 1/2819 381/165 |
| D581,397 S | 11/2008 | Masui | |
| D581,398 S | 11/2008 | Sugiyama | |
| 7,463,744 B2 * | 12/2008 | Parker | H04R 1/02 381/161 |
| D591,266 S | 4/2009 | Motoishi | |
| D600,287 S | 9/2009 | Oikawa et al. | |
| D646,665 S | 10/2011 | Iijima | |
| 8,107,662 B2 * | 1/2012 | Parker | H04R 9/022 381/164 |
| 8,130,994 B2 | 3/2012 | Button et al. | |
| 8,181,736 B2 | 5/2012 | Sterling et al. | |
| 8,290,195 B2 | 10/2012 | Chick et al. | |
| 8,418,802 B2 | 4/2013 | Sterling et al. | |
| 8,467,557 B2 | 6/2013 | Miller et al. | |
| 8,561,756 B2 * | 10/2013 | Litovsky | H04R 1/02 181/198 |
| 8,672,088 B2 | 3/2014 | Sterling et al. | |
| 8,750,540 B2 | 6/2014 | Tan | |
| 9,282,398 B2 | 3/2016 | Monroe | |
| 2002/0011379 A1 | 1/2002 | Taylor | |
| 2003/0141142 A1 | 7/2003 | Christiansen | |
| 2004/0017924 A1 * | 1/2004 | Kuratani | H04R 1/02 381/349 |
| 2004/0196999 A1 * | 10/2004 | Han | H04R 1/2819 381/345 |
| 2008/0075317 A1 * | 3/2008 | Chen | G06F 1/203 381/397 |
| 2008/0192972 A1 | 8/2008 | Lewallen | |
| 2009/0245561 A1 | 10/2009 | Litovsky et al. | |
| 2009/0310808 A1 | 12/2009 | Button et al. | |
| 2010/0053894 A1 * | 3/2010 | Chiriac | G06F 1/20 361/695 |
| 2011/0135121 A1 | 6/2011 | Harwood et al. | |
| 2012/0076328 A1 | 3/2012 | Harwood | |
| 2012/0201403 A1 | 8/2012 | Tan | |
| 2013/0213628 A1 | 8/2013 | Litovsky et al. | |
| 2013/0213730 A1 * | 8/2013 | Litovsky | H04R 1/02 181/199 |
| 2013/0228393 A1 | 9/2013 | Sterling et al. | |
| 2013/0308315 A1 | 11/2013 | Capitani et al. | |
| 2014/0321686 A1 | 10/2014 | Wegener | |
| 2016/0219369 A1 * | 7/2016 | Moro | H04R 9/022 |
| 2016/0227315 A1 * | 8/2016 | Kim | H04R 1/2819 |
| 2016/0337748 A1 * | 11/2016 | Goksel | H04R 1/2896 |
| 2017/0006376 A1 | 1/2017 | Tan | |
| 2017/0094403 A1 | 3/2017 | Tipparaju et al. | |
| 2017/0205858 A1 * | 7/2017 | Wong | G06F 1/1626 |
| 2018/0192172 A1 * | 7/2018 | Zhang | H04R 1/02 |

FOREIGN PATENT DOCUMENTS

| | | |
|---|---|---|
| EP | 0518668 A2 | 12/1992 |
| JP | S59-121991 U | 8/1984 |
| JP | S61219289 A | 9/1986 |
| JP | S61264896 A | 11/1986 |
| JP | S61264897 A | 11/1986 |
| JP | H11-234784 A | 8/1999 |
| JP | 2009141657 A | 6/2009 |
| JP | 2010093767 A | 4/2010 |
| WO | 98/09273 A1 | 3/1998 |
| WO | 2011053248 A1 | 5/2011 |
| WO | 2015014203 A1 | 2/2015 |

OTHER PUBLICATIONS

International Search Report and Written Opinion dated Apr. 7, 2016 for International application No. PCT/US2016/015521.

International Search Report and Written Opinion dated Apr. 6, 2017 for International application No. PCT/US2016/044682.

Invitation to Pay Additional Fees dated Apr. 5, 2017 for International application No. PCT/US2016/044680.

International Search Report and Written Opinion dated Jun. 28, 2017 for International application No. PCT/US2016/044680.

VISATON—Der Lautsprecherspezialist: "Kegel fur Rundstrahler", Apr. 8, 2012, pp. 1-8, XP055383099, retrieved from the Internet URL: http://www.visaton.de/vb/showthread.php?t=23544&highlight=f%C3%BCllen [retrieved on Jun. 20, 2017], p. 2—"Henrik" dialog input, p. 3—"walwal" 1st dialog input, p. 5—"walwal" dialog input.

International Search Report and Written Opinion dated Jun. 21, 2018 for International application No. PCT/US2018/025477.

First Office Action for Japanese Patent Application No. 2017540127, dated Jul. 2, 2018.

First Office Action for European Patent Application No. 16 704 759.6-1207, dated Jul. 16, 2018.

First Office Action for Japanese Patent Application No. 2017-540589, dated Oct. 5, 2018.

International Search Report and Written Opinion dated Dec. 19, 2018 for International application No. PCT/US2018/053980.

* cited by examiner

FIG. 4

ACOUSTIC DEFLECTOR WITH CONVECTIVE COOLING

BACKGROUND

This disclosure relates to an acoustic deflector that enables stack effect air flow for convective cooling of electronics.

SUMMARY

All examples and features mentioned below can be combined in any technically possible way.

In one aspect, a deflector assembly includes an acoustic deflector that defines at least a portion of an electronics compartment; and electronics mounted within the electronics compartment. The deflector assembly is configured to provide convective cooling of the electronics via a stack effect air flow through the electronics compartment.

Implementations may include one of the following features, or any combination thereof.

In some implementations, the deflector assembly also includes a base. The acoustic deflector and the base together define the electronics compartment.

In certain implementations, the base is coupled to the acoustic deflector so as to form a gap therebetween to allow a flow of ambient air into the electronics compartment for cooling the electronics.

In some cases, the acoustic deflector includes an acoustically reflective body having a truncated conical shape that has a top surface that is configured to be centered with respect to a motion axis of the electro-acoustic transducer. The acoustically reflective body has an opening in the top surface that, together with the gap, forms a chimney to provide the stack effect air flow for cooling the electronics in the electronics compartment.

In certain cases, the acoustic deflector includes an acoustically reflective body having a substantially conical outer surface.

In some examples, the substantially conical outer surface is configured to be disposed adjacent an acoustically radiating surface of an electro-acoustic transducer. The acoustically reflective body has a truncated conical shape comprising a top surface that is configured to be centered with respect to a motion axis of the electro-acoustic transducer. The substantially reflective body has an opening in the top surface that extends into the electronics compartment enabling air heated by the electronics to be exhausted out of electronics compartment.

In certain examples, the acoustic deflector includes one or more cross-members that extend across the opening.

In some implementations, the opening has an unobstructed cross-sectional area of about 2 square inches to about 4 square inches.

In certain implementations, the substantially conical outer surface includes a non-linear slant profile.

In another aspect, a speaker system includes an acoustic assembly and a deflector assembly. The acoustic assembly includes an acoustic enclosure, and an electro-acoustic transducer coupled to the acoustic enclosure. The deflector assembly includes an acoustic deflector that defines at least a portion of an electronics compartment, and electronics, for powering the electro-acoustic transducer, mounted within the electronics compartment. The deflector assembly is configured to provide convective cooling of the electronics via a stack effect air flow through the electronics compartment.

Implementations may include one of the above and/or below features, or any combination thereof.

In some implementations, the acoustic enclosure includes a hollow housing, and a baffle coupled to the hollow housing to form an acoustic cavity. The electro-acoustic transducer is mounted in a first opening in the baffle.

In certain implementations, the acoustic assembly further includes a port disposed within the acoustic cavity. The port extends from a first open end, which is acoustically coupled to the acoustic cavity, to a second open end, which is acoustic coupled to a second opening in the baffle.

In some cases, the second open end of the port is arranged such that air flow exiting the port is directed toward the deflector assembly.

In certain cases, the deflector assembly includes a base, and wherein the acoustic deflector and the base together define the electronics compartment.

In some examples, the base is coupled to the acoustic deflector so as to form a gap therebetween to allow a flow of ambient air into the electronics compartment for cooling the electronics.

In certain examples, the acoustic deflector includes an acoustically reflective body having a truncated conical shape including a top surface that is configured to be centered with respect to a motion axis of the electro-acoustic transducer. The acoustically reflective body has an opening in the top surface that, together with the gap, forms a chimney to provide the stack effect air flow for cooling the electronics in the electronics compartment.

In some implementations, the acoustic deflector includes an acoustically reflective body having a substantially conical outer surface.

In certain implementations, the substantially conical outer surface is configured to be disposed adjacent an acoustically radiating surface of the electro-acoustic transducer. The acoustically reflective body has a truncated conical shape comprising a top surface that is configured to be centered with respect to a motion axis of the electro-acoustic transducer. The substantially reflective body has an opening in the top surface that extends into the electronics compartment enabling air heated by the electronics to be exhausted out of electronics compartment.

In some cases, the acoustic deflector includes one or more cross-members that extend across the opening.

In certain cases, the opening has a cross-sectional area of about 2 square inches to about 4 square inches.

In some examples, the substantially conical outer surface includes a non-linear slant profile.

In certain examples, the acoustic driver provides an alternating air flow along the outer surface of the acoustic deflector.

In some implementations, the acoustic deflector includes a leg for coupling the acoustic deflector to the electro-acoustic transducer, such that the substantially conical outer surface is disposed adjacent to an acoustically radiating surface of the electro-acoustic transducer.

In certain implementations, the deflector assembly is configured to support, a (linear) stack effect draft flow rate of between about 75 ft/min (0.38 m/s) and about 90 ft/min (0.46 m/s) at an ambient temperature of 550° R.

DETAILED DESCRIPTION

This disclosure is based on the realization that a passive acoustic component (e.g., an acoustic deflector) of a speaker system could also be configured to provide a convective air flow for cooling a heat producing electronic component packaged within the speaker system. A direct current (d/c) air flow that is produced via the stack effect can be used to provide natural convective cooling to promote heat transfer away from the heat producing electronic component.

In the examples described below, an acoustic deflector forms an upper wall of an enclosed volume that contains electronics. The electronics can include heat producing components, such as audio amplifiers. This heat production can lead to undesirable thermal conditions in the enclosed volume. Heat is required to be efficiently transferred from the volume to improve the thermal conditions therein.

By configuring the acoustic deflector to serve as a chimney and providing a means for ambient air flow into the enclosed volume, the movement of heated air out of the enclosed volume is improved. In addition, the deflector resides adjacent an electro-acoustic transducer and a bass reflex port, which can act as sources of alternating air flow that can contribute to displacement of the heated air exhausted from the acoustic deflector.

Figure 1A:
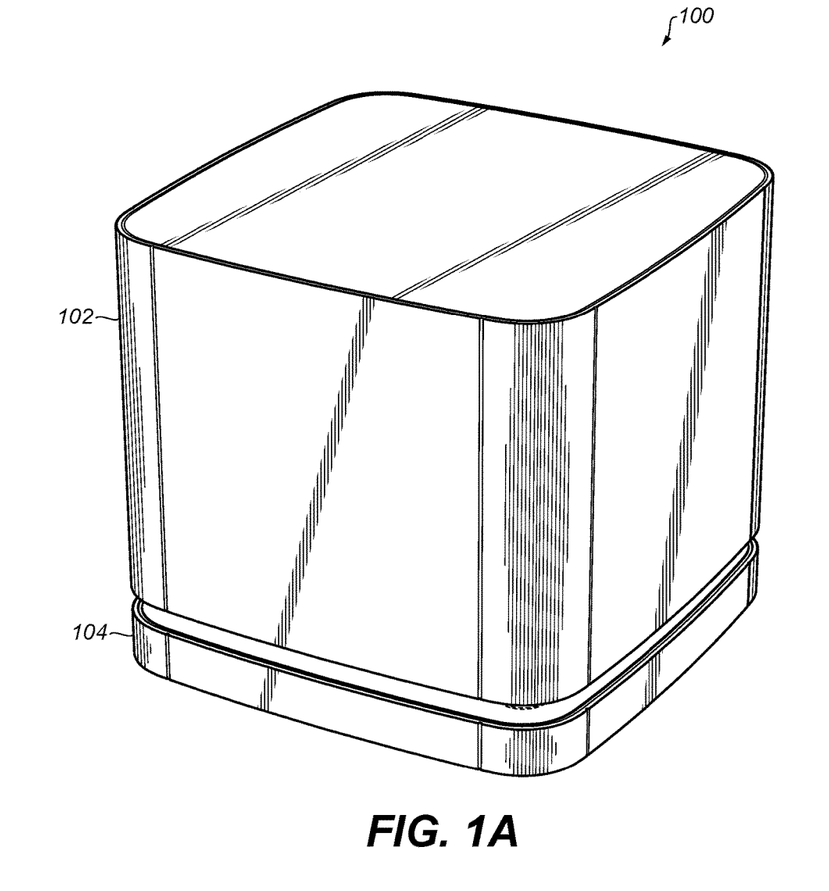
FIG. 1A is perspective view of a speaker system.
Figure 1B:
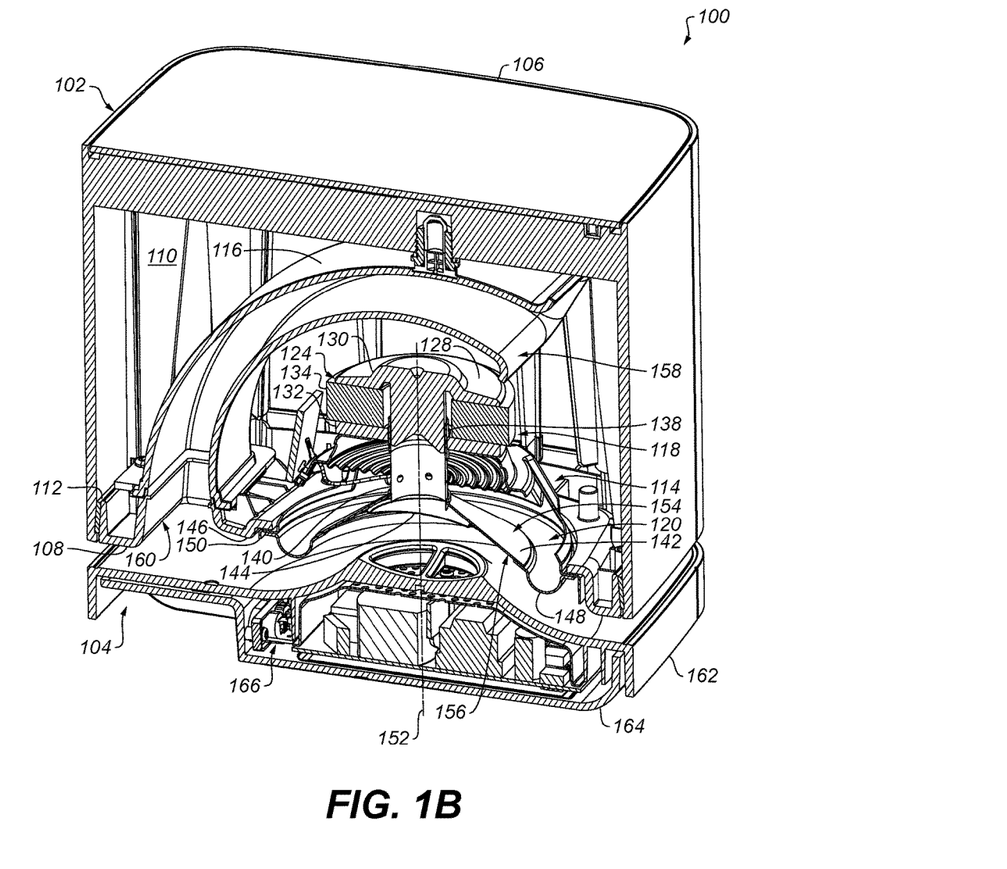
FIG. 1B is a cross-sectional perspective view of the speaker systems of FIG. 1A.
Figure 1C:
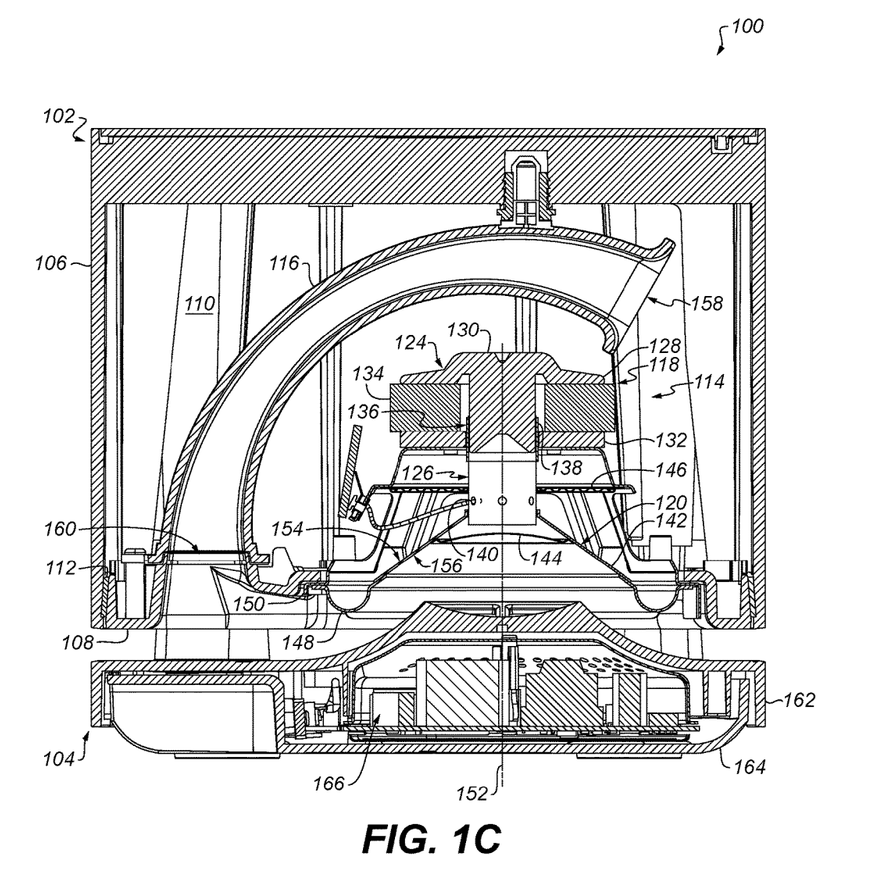
FIG. 1C is a cross-sectional side view of the speaker system of FIG. 1A.

FIGS. 1A-1C illustrate an exemplary speaker system 100, which includes an acoustic assembly 102 and a deflector assembly 104. The acoustic assembly 102 includes a housing 106 and a baffle 108. In the illustrated example, the housing 106 is a hollow cube shaped structure with one open end to which the baffle 108 is attached to form an acoustic cavity 110. The housing 106 and the baffle 108 may both be formed as molded plastic parts. A gasket material 112 may be disposed at the interface between the housing 106 and the baffle 108 to form an acoustic seal therebetween. The acoustic assembly 102 also includes an electro-acoustic transducer 114 and a port 116 (a/k/a "bass reflex port"), which are supported by the baffle 108. The transducer 114 is mounted within a first opening in the baffle 108. The transducer 114 can be any known type of electro-acoustic transducer. For example, as shown in FIGS. 1B & 1C. 1, the transducer 114 can include an electric motor 118, a diaphragm assembly 120 and a suspension 122. The motor 118 may include a magnetic circuit 124 and a voice coil assembly 126 which is driven in motion by the magnetic circuit 124. The magnetic circuit 124 may include a back plate 128, a center pole 130, a front plate 132, and a permanent magnet 134. The front plate 132 and the center pole 130 together may form a gap 136 within which the voice coil assembly 126 may be disposed. The magnet 134 provides a permanent magnetic field to oppose an alternating electromagnetic field of the voice coil assembly 126 and thereby cause the attached diaphragm assembly 120 to move. The voice coil assembly 126 may include a voice coil 138 and a bobbin 140. The diaphragm assembly 120 may include a diaphragm 142 and a dust cap 144. The suspension 122 may include a spider 146 and a surround 148. The spider 146 may couple the bobbin 140 to a frame 150 affixed to the baffle 108, and the surround 148 may couple the diaphragm 142 to the frame 150. The suspension may assist in keeping the voice coil centered, both axially and radially, within the gap of the magnetic circuit. When an electrical current in the voice coil changes direction, the magnetic forces between the voice coil and the fixed magnet also change, causing the voice coil to move along a motion axis 152. This going and coming movement of the voice coil translates to movement of the diaphragm 142. This movement of the diaphragm 142 causes changes in air pressure, which results in production of sound. The transducer 114 is arranged such that a rear radiating surface 154 of the diaphragm 142 radiates acoustic energy into the acoustic cavity 110, and such that a front radiating surface 156 of the diaphragm 142 radiates acoustic energy toward the deflector assembly 104.

The port 116 extends from a first open end 158, which is acoustically coupled to the acoustic cavity 110, to a second open end 160, which is acoustic coupled to a second opening in the baffle 108. The second open end 160 of the port 116 is arranged such that air flow exiting the port 116 is directed toward the deflector assembly 104. The port 116 enables the sound from the rear radiating surface 154 of the diaphragm 142 to increase the efficiency of the system at low frequencies as compared to a typical closed box (sealed-box) loudspeaker or an infinite baffle mounting. This design approach enhances the reproduction of the lowest frequencies generated by the transducer 114.

The deflector assembly 104 includes an acoustic deflector 162 and a bottom cap (a/k/a "base 164"), which are coupled together to form a compartment 166 (a/k/a "electronics compartment") that houses electronics 168, which power the speaker system 100. Both the omni-directional acoustic deflector 162 and the base 164 may be formed as molded plastic parts. As discussed below, to assist heat transfer out of the compartment 166, in order to provide for more suitable thermal conditions for the electronics, the deflector assembly 104 can be configured to provide a stack effect (a/k/a "chimney effect") air flow through the compartment.

Figure 2:
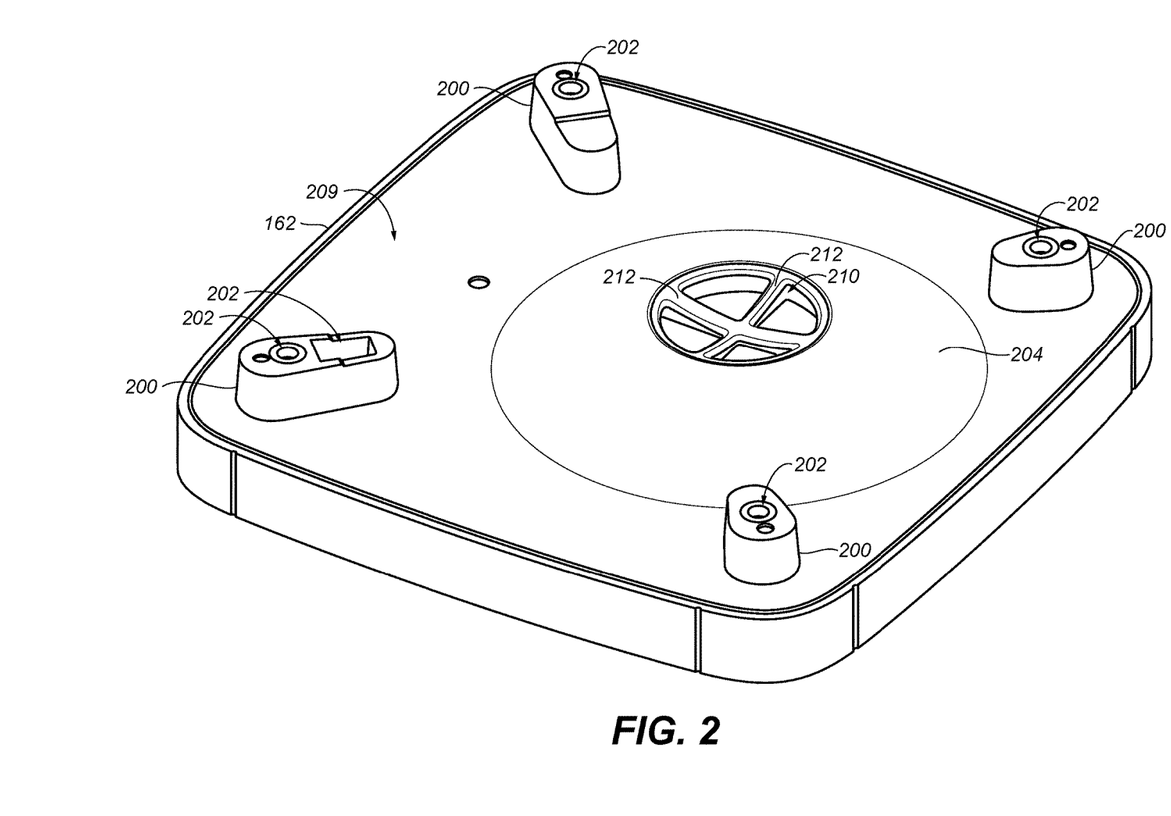
FIG. 2 is a perspective view of an acoustic deflector of the speaker system of FIG. 1A.

Referring to FIG. 2, the acoustic deflector 162 has four vertical legs 200 (a/k/a "mounting pillars") to which the acoustic assembly 102 (FIGS. 1A-1C) is mounted. In that regard, each of the legs 200 includes a mounting hole 202 for receiving a fastener (e.g., a screw, not shown) for coupling the omni-directional acoustic deflector 162 to the baffle 108 (see, e.g., FIG. 1C). One of the legs 200 includes an additional aperture (a/k/a "wiring aperture 204") through which electrical wires can pass for electronically coupling the electronics 168 to the transducer 114; i.e., for driving motion of the transducer 114. A corresponding aperture (not shown) may be provided in the baffle. Acoustic energy generated by the transducer 114 propagates downward and is deflected into a nominal horizontal direction by an acoustically reflective body 204 of the acoustic deflector 162.

There are four substantially rectangular openings 206. Each opening 206 is defined by the acoustic assembly 102 (FIG. 1C), the acoustic deflector 162 and a pair of the vertical legs 206. These four openings 206 are acoustic apertures which pass the horizontally propagating acoustic energy. The propagation of the acoustic energy in a given direction includes a spreading of the propagating acoustic energy, for example, due to diffraction.

The illustrated acoustically reflective body 204 has a nominal truncated conical shape that is configured to be centered (i.e., coaxial) with respect to the motion axis (item 152, FIG. 1C) of the transducer 114. In some cases, the slope of the conical outer surface between the base and vertex of the cone (a/k/a "cone axis") is not constant. For example, the outer surface may have a non-linear slant profile such as a parabolic profile or a profile described by a truncated hyperboloid of revolution. The acoustic deflector 162 also has a substantially flat region 209 that underlies the second open end 160 of the port 114.

An opening 210 is provided in the top surface of the acoustically reflective body 204. The opening 210 extends into the electronics compartment 166 (FIG. 1C). A pair of cross members 212 are provided in the opening 210 to inhibit large objects from getting into the electronics compartment. The cross members 212 may also help to provide some structural rigidity to the acoustic deflector 162. The opening 210 can have an unobstructed cross sectional area of about 2 in$^2$ to about 4 in$^2$, e.g., 3.1 in$^2$. The term "unobstructed" as used herein is intended to mean free of any obstruction such as an acoustically absorbent (e.g., foam) member or screen, and allowing the free flow of air.

Figure 3:
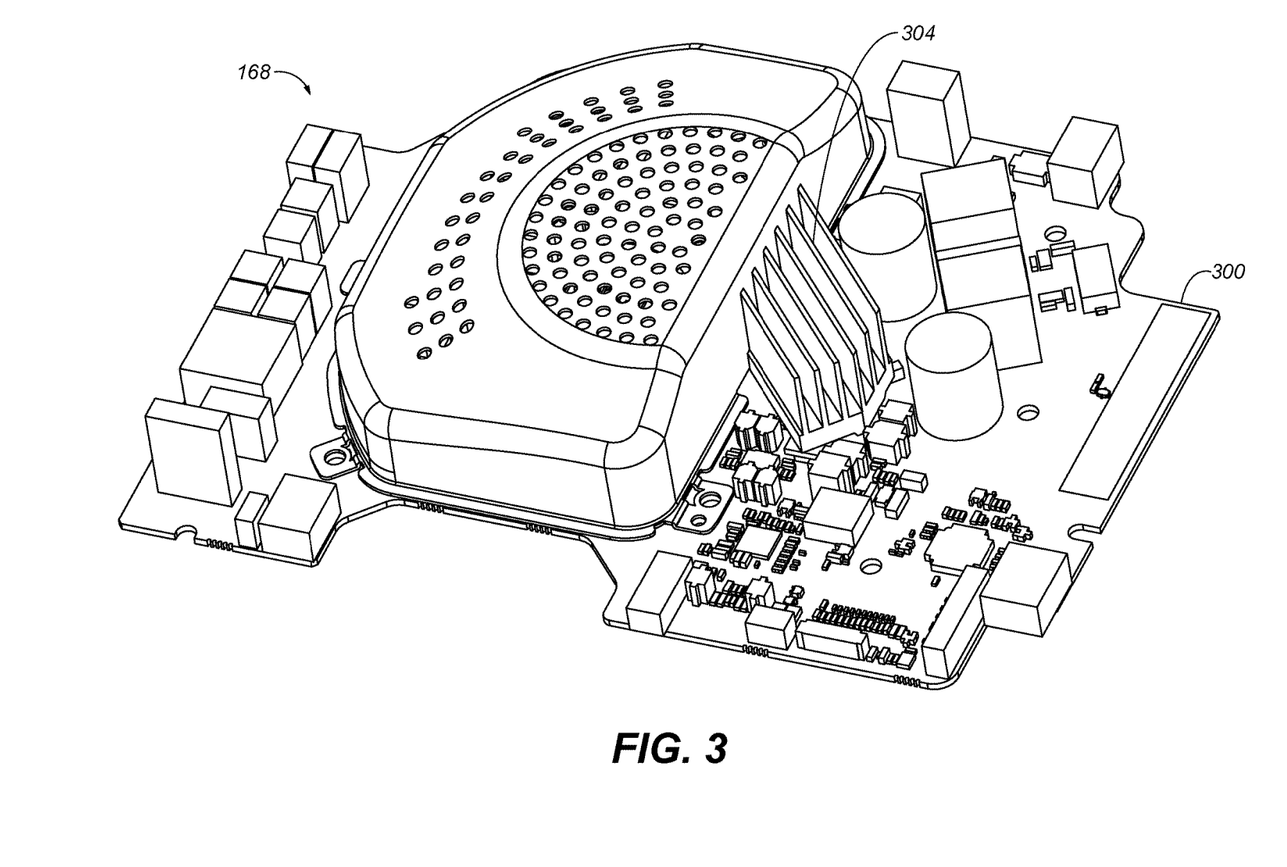
FIG. 3 is a perspective view of an electronics assembly from the speaker system of FIG. 1A.

Referring to FIG. 3, The electronics 168 include a printed circuit board 300 that includes a plurality of electronic components mounted thereto. The electronic components include, among other things, an amplifier chip (see item 302, FIG. 4) which sits beneath a finned heat sink 304. The amplifier chip 302 can dissipate 5 Watts to 10 Watts of power, e.g., 8 Watts. The remainder of the electronics 168 may dissipate another 2 Watts to 12 Watts for a total of about 10 Watts to 20 Watts, e.g., 14.2 Watts, of power dissipated from the electronics 168.

Figure 4:
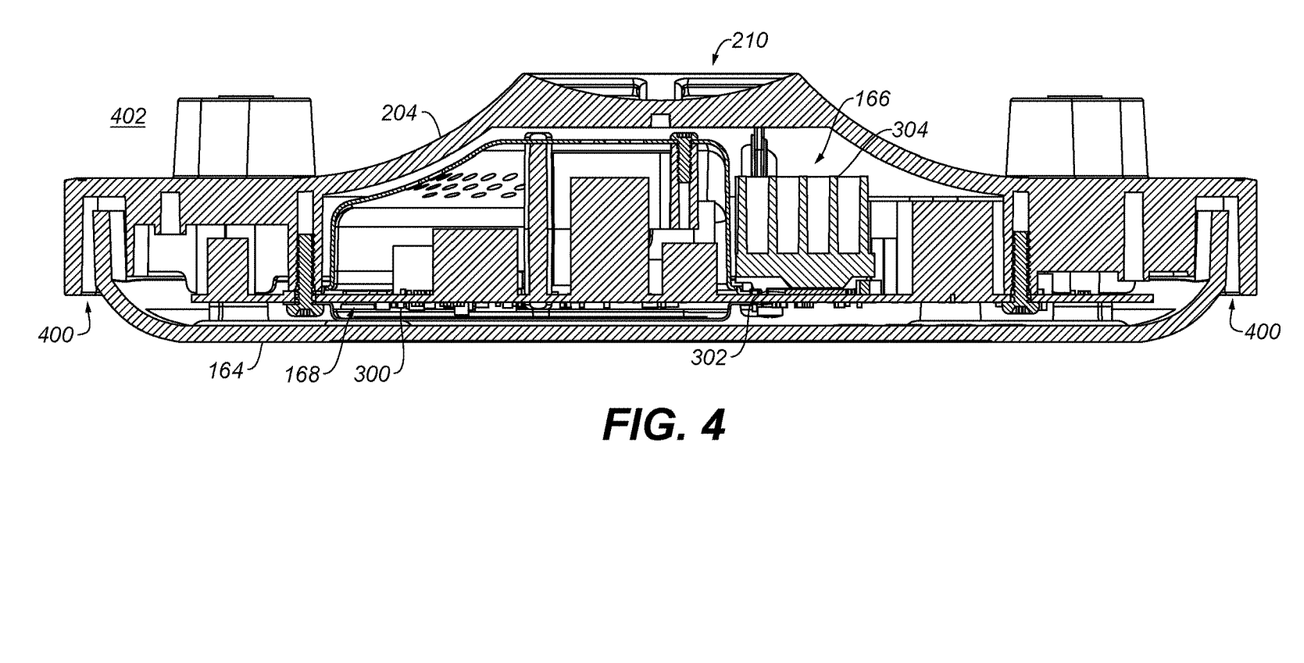
FIG. 4. is a cross-sectional view of a deflector assembly from the acoustic assembly of FIG. 1A.

With reference to FIG. 4, the base 164 provides the main support for the electronics 168. In that regard, the printed circuit board 300 is secured to the base 164 (e.g., with screws). The base 164 is then secured to bosses/standoffs formed in the deflector 162 with screws. Notably, a gap 400 is formed between the base 164 and the deflector 162 to allow air to pass from a region 402 surrounding the speaker system 100 into the electronics compartment 166. The opening 210 at the apex of the acoustically reflective body 204 and the gap 400 work together as a chimney. In that regard, the power dissipated by the electronics 168 heats air within the electronics compartment 166. The heated air rises and is exhausted out of the opening 210 because of buoyancy due a difference in air density between the electronics compartment 166 and the region 402 surrounding of the speaker system 100. This displacement of the heated air draws cool (ambient) air from the region 402 surrounding of the speaker system 200 into the electronics compartment 166, where it is subsequently heated and exhausted through the opening 210 resulting in a d/c air flow through the electronics compartment 165. This stack effect air flow helps to drive convective cooling of the electronics 168.

The deflector assembly 104 is configured to support a linear draft flow rate, induced by the stack effect (a/k/a "stack effect draft flow rate"), of between about 75 ft/min (0.38 m/s) and about 90 ft/min (0.46 m/s) at an ambient temperature of 550° R (32° C.).

In one example, the opening 210 has a diameter of about 2.0 inches (50.5 mm) and a height of about 1.9 inches (47.2 mm); and the average temperature inside the electronics compartment 166 is about 632° R (78° C.) to about 656.4° R (91.5° C.), and supports a linear stack effect draft flow rate of between about 75 ft/min and about 90 ft/min at an ambient temperature of about 550° R (32° C.).

An a/c air flow resulting from the movement of the transducer 114 and the displacement of air through the port 116 can help to further displace the heated exhaust air away from the opening 210.

A number of implementations have been described. Nevertheless, it will be understood that additional modifications may be made without departing from the scope of the inventive concepts described herein, and, accordingly, other implementations are within the scope of the following claims.

What is claimed is:

1. A deflector assembly comprising:
   an acoustic deflector;
   a base coupled to the acoustic deflector, the acoustic deflector and the base together defining an electronics compartment; and
   electronics mounted within the electronics compartment,
   wherein the deflector assembly is configured to provide convective cooling of the electronics via a stack effect air flow through the electronics compartment,
   wherein the base is coupled to the acoustic deflector so as to form a gap therebetween to allow a flow of ambient air into the electronics compartment for cooling the electronics, and
   wherein the acoustic deflector, the base, and the gap therebetween all share a common horizontal plane.

2. The deflector assembly of claim 1, wherein a portion of the base adjacent the gap is between two portions of the acoustic deflector, and the two portions of the acoustic deflector share the common horizontal plane.

3. The deflector assembly of claim 2, wherein the base is coupled to standoffs formed in the acoustic deflector using screws.

4. The deflector assembly of claim 1,
   wherein the acoustic deflector comprises an acoustically reflective body having a truncated conical shape comprising a top surface that is configured to be centered with respect to a motion axis of the electro-acoustic transducer, and
   wherein the acoustically reflective body has an opening in the top surface that, together with the gap, forms a chimney to provide the stack effect air flow for cooling the electronics in the electronics compartment.

5. The deflector assembly of claim 1, wherein the acoustic deflector comprises an acoustically reflective body having a substantially conical outer surface.

6. The deflector assembly of claim 5, wherein the substantially conical outer surface comprises a non-linear slant profile.

7. The deflector assembly of claim 1,
   wherein the substantially conical outer surface is configured to be disposed adjacent an acoustically radiating surface of an electro-acoustic transducer,
   wherein the acoustically reflective body has a truncated conical shape comprising a top surface that is configured to be centered with respect to a motion axis of the electro-acoustic transducer, and
   wherein the substantially reflective body has an opening in the top surface that extends into the electronics compartment enabling air heated by the electronics to be exhausted out of electronics compartment.

8. The deflector assembly of claim 7, wherein the acoustic deflector comprises one or more cross-members that extend across the opening.

9. The deflector assembly of claim 7, wherein the opening has an unobstructed cross-sectional area of about 2 square inches to about 4 square inches.

10. A speaker system comprising:
    an acoustic assembly comprising
    an acoustic enclosure, and
    an electro-acoustic transducer coupled to the acoustic enclosure; and
    a deflector assembly comprising an acoustic deflector,
a base coupled to the acoustic deflector, the acoustic deflector and the base together defining an electronics compartment, and
electronics, for powering the electro-acoustic transducer, mounted within the electronics compartment,
wherein the deflector assembly is configured to provide convective cooling of the electronics via a stack effect air flow through the electronics compartment,
wherein the base is coupled to the acoustic deflector so as to form a gap therebetween to allow a flow of ambient air into the electronics compartment for cooling the electronics, and
wherein the acoustic deflector, the base, and the gap therebetween all share a common horizontal plane.

11. The speaker system of claim 10, wherein the acoustic enclosure comprises:
a hollow housing; and
a baffle coupled to the hollow housing to form an acoustic cavity, and
wherein the electro-acoustic transducer is mounted in a first opening in the baffle.

12. The speaker system of claim 11,
wherein the acoustic assembly further comprises a port disposed within the acoustic cavity, and
wherein the port extends from a first open end, which is acoustically coupled to the acoustic cavity, to a second open end, which is acoustic coupled to a second opening in the baffle.

13. The speaker system of claim 12, wherein the second open end of the port is arranged such that air flow exiting the port is directed toward the deflector assembly.

14. The speaker system of claim 10, wherein a portion of the base adjacent the gap is between two portions of the acoustic deflector, and the two portions of the acoustic deflector share the common horizontal plane.

15. The speaker system of claim 14, wherein the base is coupled to standoffs formed in the acoustic deflector using screws.

16. The speaker system of claim 10,
wherein the acoustic deflector comprises an acoustically reflective body having a truncated conical shape comprising a top surface that is configured to be centered with respect to a motion axis of the electro-acoustic transducer, and
wherein the acoustically reflective body has an opening in the top surface that, together with the gap, forms a chimney to provide the stack effect air flow for cooling the electronics in the electronics compartment.

17. The speaker system of claim 10, wherein the acoustic deflector comprises an acoustically reflective body having a substantially conical outer surface.

18. The speaker system of claim 17, wherein the substantially conical outer surface comprises a non-linear slant profile.

19. The speaker system of claim 17, wherein the acoustic driver provides an alternating air flow along the outer surface of the acoustic deflector.

20. The speaker system of claim 17, wherein the acoustic deflector comprises a leg for coupling the acoustic deflector to the electro-acoustic transducer, such that the substantially conical outer surface is disposed adjacent to an acoustically radiating surface of the electro-acoustic transducer.

21. The speaker system of claim 10,
wherein the substantially conical outer surface is configured to be disposed adjacent an acoustically radiating surface of the electro-acoustic transducer,
wherein the acoustically reflective body has a truncated conical shape comprising a top surface that is configured to be centered with respect to a motion axis of the electro-acoustic transducer, and
wherein the substantially reflective body has an opening in the top surface that extends into the electronics compartment enabling air heated by the electronics to be exhausted out of electronics compartment.

22. The speaker system of claim 21, wherein the acoustic deflector comprises one or more cross-members that extend across the opening.

23. The speaker system of claim 21, wherein the opening has a cross-sectional area of about 2 square inches to about 4 square inches.

24. The speaker system of claim 10, wherein the deflector assembly is configured to support, a stack effect draft flow rate of between about 75 ft/min (0.38 m/s) and about 90 ft/min (0.46 m/s) at an ambient temperature of 550° R.

* * * * *